(12) United States Patent
Oleson

(10) Patent No.: US 10,051,735 B2
(45) Date of Patent: Aug. 14, 2018

(54) PACKAGING FOR HIGH POWER INTEGRATED CIRCUITS AND INFRARED EMITTER ARRAYS

(71) Applicant: OLESON CONVERGENT SOLUTIONS LLC, Santa Barbara, CA (US)

(72) Inventor: Jim Oleson, Santa Barbara, CA (US)

(73) Assignee: Oleson Convergent Solutions LLC, Santa Barbara, CA (US)

( * ) Notice: Subject to any disclaimer, the term of this patent is extended or adjusted under 35 U.S.C. 154(b) by 0 days.

(21) Appl. No.: 15/797,233

(22) Filed: Oct. 30, 2017

(65) Prior Publication Data

US 2018/0070447 A1 Mar. 8, 2018

Related U.S. Application Data

(60) Continuation-in-part of application No. 15/589,431, filed on May 8, 2017, now Pat. No. 9,812,378, which
(Continued)

(51) Int. Cl.
*H01L 23/34* (2006.01)
*H05K 1/11* (2006.01)
(Continued)

(52) U.S. Cl.
CPC .......... *H05K 1/113* (2013.01); *H01L 23/473* (2013.01); *H01L 23/12* (2013.01); *H01L 24/05* (2013.01); *H01L 24/13* (2013.01); *H01L 24/16* (2013.01); *H01L 24/29* (2013.01); *H01L 24/32* (2013.01); *H01L 24/81* (2013.01); *H01L 25/072* (2013.01); *H01L 2224/0401* (2013.01); *H01L 2224/0557* (2013.01); *H01L 2224/05552* (2013.01); *H01L 2224/05568* (2013.01); *H01L 2224/131* (2013.01); *H01L 2224/16225* (2013.01); *H01L 2224/2919* (2013.01); *H01L 2224/32225* (2013.01); *H01L 2224/81193* (2013.01);
(Continued)

(58) Field of Classification Search
CPC .......... H01L 23/473; H01L 2323/4056; H01L 2323/403; H05K 7/20254
USPC ......... 257/704, 706, 707, 714; 438/106, 122
See application file for complete search history.

(56) References Cited

U.S. PATENT DOCUMENTS 5,182,632 A * 1/1993 Bechtel ............... H01L 23/3675
257/713
5,270,571 A * 12/1993 Parks ..................... H01L 23/29
165/185

(Continued)

*Primary Examiner* — Sheila V. Clark
(74) *Attorney, Agent, or Firm* — Kutak Rock LLP; Neil L. Amey

(57) ABSTRACT

A product and method for packaging high power integrated circuits or infrared emitter arrays for operation through a wide range of temperatures, including cryogenic operation. The present invention addresses key limitations with the prior art, by providing temperature control through direct thermal conduction or active fluid flow and avoiding thermally induced stress on the integrated circuits or emitter arrays. The present invention allows for scaling of emitter arrays up to extremely large formats, which is not viable under the prior art. The present invention eliminates or otherwise reduces risks associated with vaporization of coolant within the heatsink structure.

25 Claims, 11 Drawing Sheets

Related U.S. Application Data is a division of application No. 14/327,307, filed on Jul. 9, 2014, now Pat. No. 9,706,655.

(60) Provisional application No. 61/844,246, filed on Jul. 9, 2013.

(51) Int. Cl.
*H01L 23/473* (2006.01)
*H01L 23/12* (2006.01)
*H01L 23/00* (2006.01)
*H01L 25/07* (2006.01)

(52) U.S. Cl.
CPC ............... *H01L 2924/00014* (2013.01); *H01L 2924/014* (2013.01); *H01L 2924/10253* (2013.01); *H01L 2924/10272* (2013.01); *H01L 2924/10329* (2013.01); *H01L 2924/14* (2013.01); *H01L 2924/157* (2013.01)

(56) References Cited

U.S. PATENT DOCUMENTS

| | | | | |
|---|---|---|---|---|
| 6,452,798 B1 * | 9/2002 | Smith | ................... | H01L 23/345 |
| | | | | 165/80.4 |
| 2005/0205989 A1 * | 9/2005 | Shibuya | ................... | C09K 5/14 |
| | | | | 257/712 |

* cited by examiner

PACKAGING FOR HIGH POWER INTEGRATED CIRCUITS AND INFRARED EMITTER ARRAYS

CROSS-REFERENCE TO RELATED APPLICATIONS

This application is a continuation-in-part application of co-pending U.S. patent application Ser. No. 15/589,431, filed on May 8, 2017, which is a divisional application of U.S. patent application Ser. No. 14/327,307, filed Jul. 9, 2014, now U.S. Pat. No. 9,706,655, which claims priority pursuant to 35 U.S.C. 119(e) to U.S. Provisional Patent Application, Ser. No. 61/844,246, filed Jul. 9, 2013, the entire disclosures of which are incorporated herein by reference.

GOVERNMENT RIGHTS

This invention was made with government support under Phase I of the SBIR program awarded by the United States Missile Defense Agency. The government has certain rights in the invention.

FIELD OF THE INVENTION

The present invention relates to a product and method for packaging high power integrated circuits and infrared emitter arrays for use in wide temperature ranges, including cryogenic operation. The present invention addresses key issues existing with current technology, including: temperature control and thermally induced stress for integrated circuits and emitter arrays and allows for scaling of emitter arrays up to extremely large formats, including those beyond 1024×1024 pixels.

BACKGROUND OF THE INVENTION

An industry wide problem exists with scaling of infrared emitter arrays up to extremely large formats. Single silicon chip arrays beyond 1024×1024 pixels fail to yield, thus creating a producibility problem and effectively limiting the size of single-chip emitter arrays. The need for larger arrays goes unmet due to this physical size restriction and is aggravated by thermal constraints of existing packaging architectures. Creating a multi-chip emitter array can avoid the single chip producibility problem. Multi-chip emitter arrays, however, introduce other problems, including the need for individual "subarrays" to be precisely aligned on the package and be maintained in a stress-free alignment through a wide temperature range. The package, therefore, has become the limiting factor in emitter array size for both single chip and multi chip configurations, particularly when operating at cryogenic temperatures.

In addition, because infrared emitter arrays are high power devices, extending the array size creates a further problem of packaging the emitter array for operation away from the assembly temperature. Coefficient of Thermal Expansion (CTE) of an array is substantially different from CTEs of most packaging materials. Therefore, emitter arrays for use at extreme temperatures, such as cryogenic environments, can suffer catastrophic stress failure when packaged using historical materials such as ceramics, copper and epoxies. Maintaining chip temperature at high power levels also is quite difficult because of the number of thermal interfaces created through the use of stress limiting features.

The historic limitations of chip yield and thermal stress serve as a roadblock to producing very large format high power emitter arrays or integrated circuits to be operated both at room and cryogenic temperatures.

The present invention overcomes the limitations on package size for emitter arrays and integrated circuits by using new materials and assembly techniques to facilitate splitting the emitter array into several precisely aligned subarrays and preserving stress-free alignment and thermal conductivity at all required temperatures. The invention also addresses thermal stress issues encountered by very large format monolithic architectures operating at cooled or cryogenic temperature. The present invention provides the thermal, electrical, and mechanical interfaces, while allowing for precise mechanical alignment and then preserving that alignment over a wide range of temperatures. The present invention also allows the size of infrared emitter arrays to be expanded to sizes demanded by current and future markets.

During cryogenic cooling, coolant can warm to its vaporization temperature, creating heat and/or pressure differential issues. Entrapping large volumes of coolant within an interior cavity, or otherwise hindering the large volume of coolant from exiting the interior cavity, can exacerbate the associated risks. U.S. Patent Application Ser. Nos. 61/844,246, filed Jul. 9, 2013, Ser. No. 14/327,307, filed Jul. 9, 2014 and issued as U.S. Pat. No. 9,706,655, and Ser. No. 15/589,431, filed May 8, 2017, the entire disclosures of which are incorporated herein by reference, disclose superior systems for and methods of cooling high-powered components, including some systems for and/or methods of reducing or eliminating risks associated with coolant vaporization.

SUMMARY OF INVENTION

The following summary of the invention is provided to facilitate an understanding of some of the innovative features unique to the present invention. The present invention is not intended to be limited by this summary.

The present invention relates to packaging for a plurality of high power emitter arrays and/or integrated circuits, where such packaging provides stress management, temperature control, and alignment for the emitter arrays and integrated circuits. By reducing stress, controlling temperatures, and managing alignment of emitter arrays and integrated circuits, the present invention allows the size of infrared emitter arrays to be expanded in size up to 19.66× 19.66 cm (4096×4096 pixels at a 48 micron pitch) and beyond. The present invention also allows for high density smaller chips (2048×2048 pixels on a 24 micron pitch, for example), to be packaged and thermal cycled.

The methods for controlling temperatures employed by the present invention include either direct conduction, active fluid flow, or a combination of the two. When direct conduction is used, the heat generated by the integrated circuit or emitter array is conducted through the chip into the package via a solder or other thermally conductive interface. The interface is compliant so that it may expand and contract with temperature in accordance with the integrated circuit and package. When active fluid flow is used to control temperatures, coolant fluid flows through an internal cavity of the package. Heat transfer from the package to the fluid takes place and is facilitated by a conductive material such as a foam or mesh layer within said internal cavity. The conductive material within the cavity is bonded to one or more walls of the cavity. In one embodiment the conductive material within the internal cavity is made from the same material as the body of the package to allow the package and conductive material within the internal cavity to expand and contract with temperature in a highly synchronous and stress-free manner. When used together, conduction and active fluid flow increases heat transfer from the integrated circuit.

A preferred material for the body of the package in some embodiments of the present invention is Carbon Silicon Carbide (C—SiC). In some embodiments, formulations of Silicon Carbide (SiC) are used. C—SiC is a preferred material in some embodiments because it has a CTE near 2.6 microns/Meter ° Kelvin and a thermal conductivity near 150 Watts/Meter Kelvin, which are compatible with silicon integrated circuits and emitter arrays. In some embodiments utilized for higher CTE applications (such as with Gallium Arsenide or similar integrated circuits), a preferred package material is SiC in its many compositions.

In some embodiments of packages where active fluid flow is used to advance heat transfer, a preferred conductive material used in the internal cavity is C—SiC foam. In some embodiments, the conductive material is precisely machined or fabricated to fill the internal cavity to enhance direct conduction of heat away from the integrated circuit to the cooling liquid. In some embodiments, the conductive material used in the internal cavity is copper, aluminum, copper-tungsten or other metal mesh. The conductive material used to fill the internal cavity is bonded to one or more walls of the internal cavity using a thermally compatible epoxy, a siliconization reflow process, or by reflowing a metal solder or braze material.

In some embodiments of the present invention using active fluid flow, a preferred method for forming the internal cavity is to machine or fabricate a body with an opening to one side and a lid to enclose the opening to the internal cavity. During the assembly process of some such embodiments, the body and lid are bonded together using epoxy, solder, braze or other bonding medium. In some embodiments, other methods for fabricating a package with an internal cavity are used.

In some embodiments of the present invention, the top, external surface of the package is flat for direct bonding of the integrated circuit or emitter array without the need for a ceramic or other type of chip carrier. Some embodiments of the present invention are configured to further enhance heat transfer away from the integrated circuit or emitter arrays. In some such embodiments, the top, external surface of the package is metallized for direct interfacing to the integrated circuit or emitter arrays, such as by using techniques such as bump bonding. In other such embodiments, the top, external surface of the package accepts an integrated circuit or emitter array mounted in a chip carrier, which is then bonded to the top surface.

The package of the present invention includes a method for precision alignment of the infrared emitter array or integrated circuit. In some embodiments, precision alignment is achieved by using precisely placed reference pins in the top surface of the package. The pins provide mechanical stops against which the integrated circuit or emitter array rests. An alternative approach is to machine precisely toleranced grooves into the top surface of the package to provide mechanical stops for placing the integrated circuit or emitter array. SiC and C—SiC can be machined to extremely fine tolerances, making packages of the present invention ideal for the use of accurately placed mechanical features. A further approach is to bond the emitter array onto the package, using precision alignment tooling and reference datums on the emitter array and package. In this approach the emitter array is aligned over the package using the precision alignment tooling, is brought into contact with the flat top surface of the package, and then is bonded to the package using a solder or epoxy. In some embodiments, other methods known in the art are used to achieve precision alignment.

Some embodiments of the present invention include a plurality of feedthrus for the coolant fluid with the feedthrus bolted together from within to provide compressive load on the package. In some embodiments, a preferred material for the feedthrus is Invar. The seal between each feedthru and package is provided by rubber O-rings, such as Viton. In some embodiments, such as some embodiments utilized for cryogenic applications, a metal or other specialized seal is preferred. In some embodiments, the seal includes a metallic coil structure embedded in a non-metallic material. In some embodiments the metallic coil structure is formed from steel. In some embodiments, the non-metallic material is Teflon. In some embodiments, the seal is an O-ring. In other embodiments, the seal looks and/or acts like an O-ring.

Some embodiments have a plurality of inserts installed in the package body for accepting fasteners for interfacing with peripheral components such as optical apertures and windows, close proximity circuit cards, temperature sensors, or even cooling straps. The inserts provide threaded stress-free interfaces between the C—SiC or SiC package and the fasteners themselves.

Some embodiments have a plurality of thru-holes for mounting bolts, which allow the package with the integrated circuits or emitter arrays to be mounted onto other surfaces such as cooling straps or rails. The thru-hole and mounting bolts allow for tight bonding of the package without creating any tensile or shearing stress on the package.

DESCRIPTION OF DRAWINGS

The accompanying figures are incorporated herein and form a part of the specification for the present invention and further illustrate the present invention.

DETAILED DESCRIPTION OF INVENTION

Figure 1:
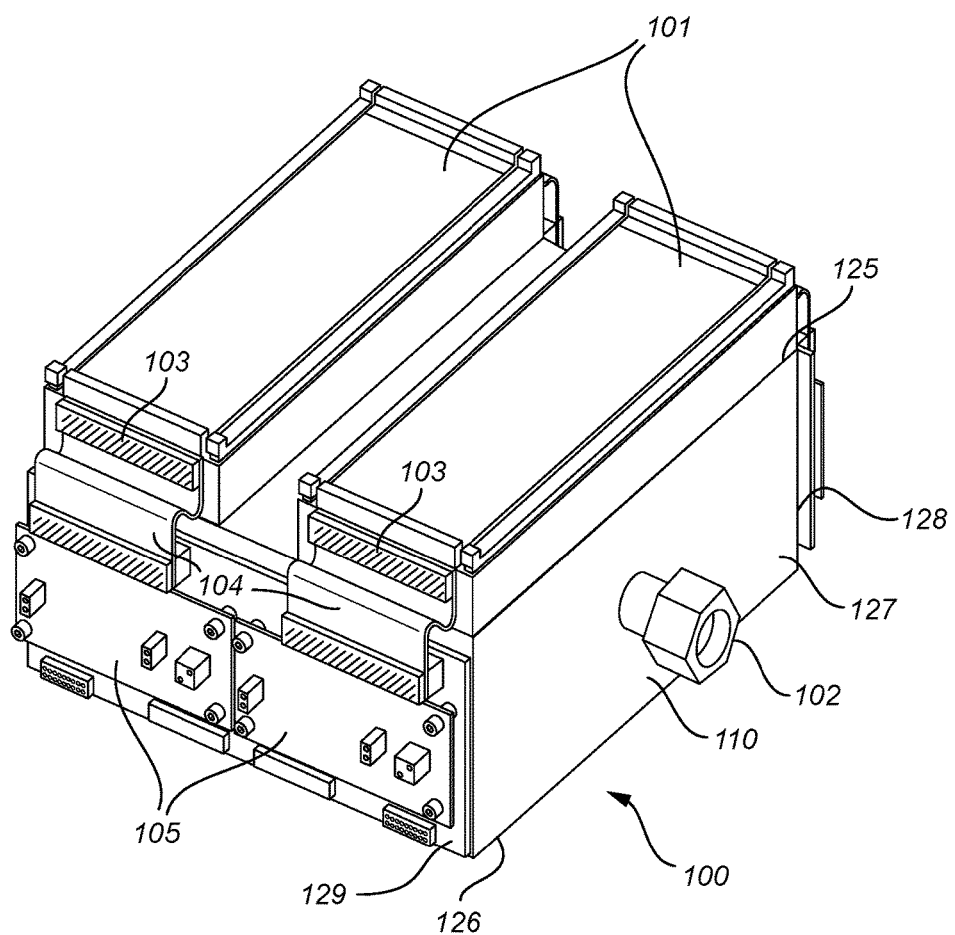
FIG. 1 is a perspective view of one embodiment of two high power integrated circuits mounted on the thermally conductive, stress free package of the present invention. The package of FIG. 1 utilizes both direct conduction and active fluid flow.

FIG. 1 shows an embodiment of the package 100 of the present invention with two pairs of precision edge butted and aligned high power integrated circuits 101 mounted on the top surface 125 of the package 100. In some embodiments of the present invention, the body 110 of the package 100 is made from C—SiC. In some embodiments, C—SiC is a preferred material for the body 110 because it has a CTE near 2.6 microns/Meter ° Kelvin and a thermal conductivity near 150 Watts/Meter Kelvin, which are compatible with silicon integrated circuits and emitter arrays. In some embodiments, other materials with similar CTE and thermal conductivity, such as some formations of SiC, are used for the package. In some embodiments utilized for higher CTE applications (such as with Gallium Arsenide integrated circuits), a preferred package 100 material is SiC.

The top surface 125 of the package 100 is machined or otherwise fabricated to be flat allowing for precise bonding and alignment of integrated circuits 101 onto the top surface 125 of the package 100. In alternative embodiments, a chip carrier containing one or more integrated circuits or emitter arrays is then bonded to the flat top surface 125 of the package 100. In some embodiments, integrated circuits 101 or chip carriers are bonded to the package 100 using epoxy, solder or a braze material.

Figure 3:
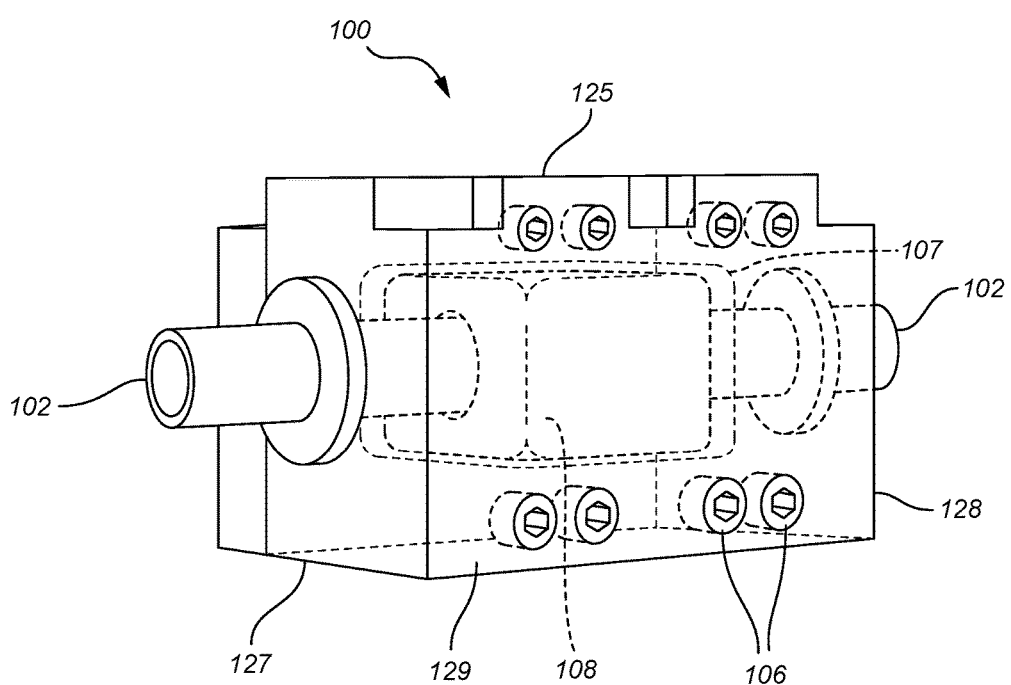
FIG. 3 is a transparent, side view of one embodiment of the thermally conductive, stress free package of the present invention for use in mounting high power emitter arrays or integrated circuits. The package of FIG. 3 utilizes both direct conduction and active fluid flow.
Figure 4:
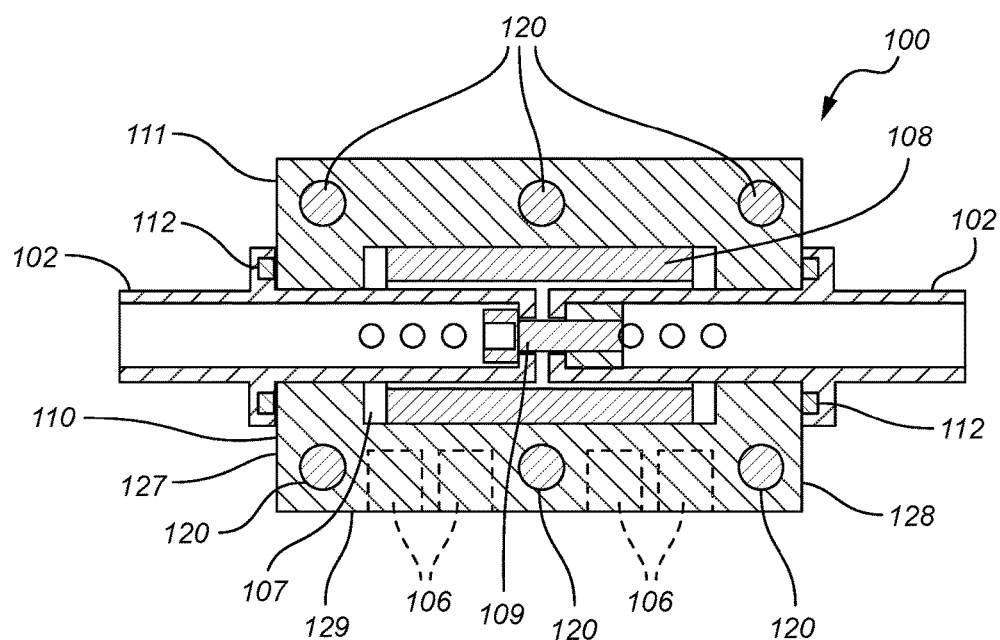
FIG. 4 is a cross-sectional, bottom view of one embodiment of the thermally conductive, stress free package of the present invention for use in mounting high power emitter arrays or integrated circuits. The package of FIG. 4 utilizes both direct conduction and active fluid flow.
Figure 5:
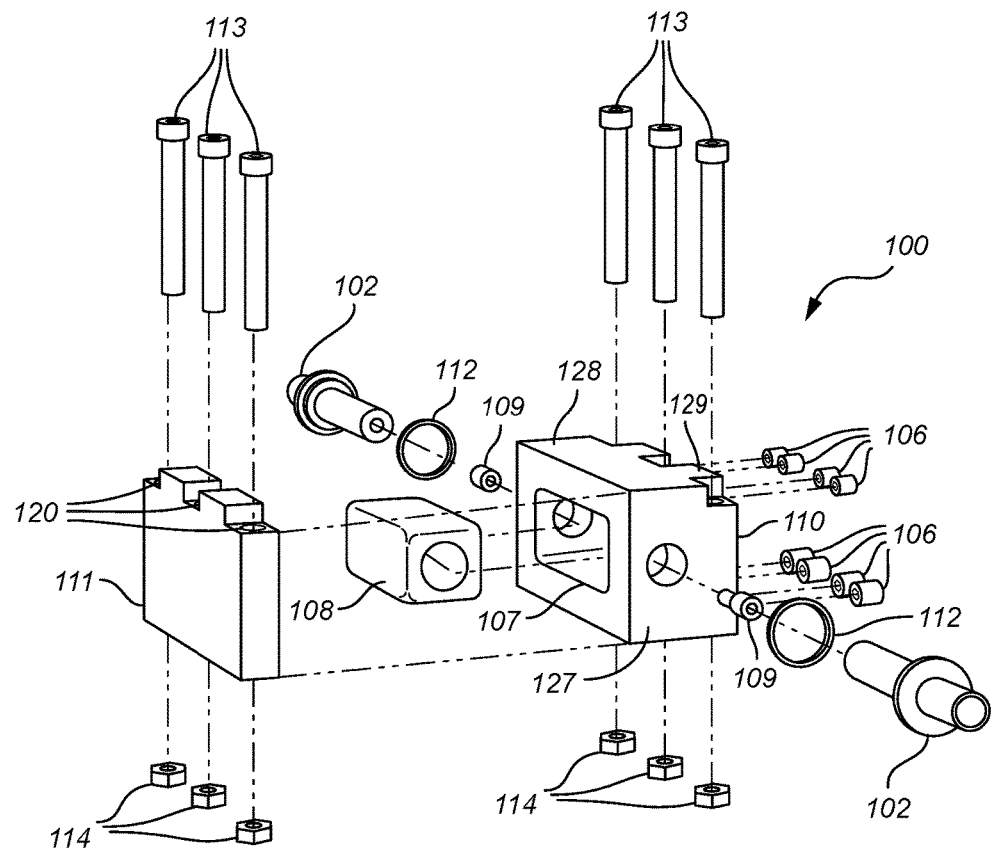
FIG. 5 is an exploded view of one embodiment of the thermally conductive, stress free package of the present invention for use in mounting high power emitter arrays or integrated circuits. The package of FIG. 5 utilizes both direct conduction and active fluid flow.

The package 100 as shown in FIG. 1 has a top surface 125, a bottom surface 126, and a plurality of sides 127, 128, 129. The package 100 includes a body 110 with an internal cavity 107 (as shown in FIGS. 3-5) and coolant feedthrus 102, which allow liquid coolant to flow through the internal cavity 107 of the package 100 for active fluid flow heat transfer. FIG. 1 shows one of a plurality of coolant feedthrus 102. FIG. 1 also shows circuit cards 105 attached to one side 129 of the package. The circuit cards are attached using fastener inserts 106 (as shown in FIGS. 2-3) on one side of the package 100, electrical interfaces 103 for connecting the integrated circuits 101 to the circuit cards 105, and interface cables 104 for making the connection between the integrated circuits 101 and the circuit cards 105.

Figure 2:
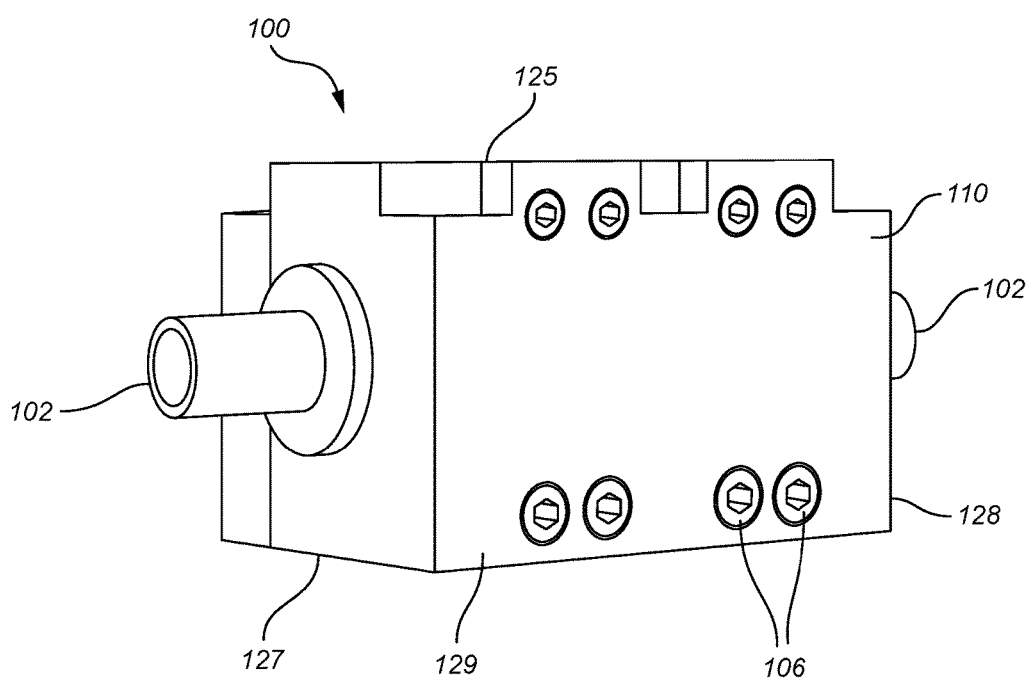
FIG. 2 is a perspective, side view of one embodiment of the thermally conductive, stress free package of the present invention for use in mounting high power emitter arrays or integrated circuits. The package of FIG. 2 utilizes both direct conduction and active fluid flow.

FIG. 2 shows an embodiment of the package 100 of the present invention utilizing both active fluid flow and direct conduction. FIG. 2 is a side view of the package 100, showing two coolant feedthrus 102, extending from one side 127 through the internal cavity 107 (shown in FIGS. 3-6) to another side 128 of the package 100. In some embodiments, the feedthrus 102 are a hard, low thermal expansion metal that readily accepts clamps and other fluid interface fittings, such as Invar or other low CTE material. The feedthrus 102 also are thermally matched to the body 110 of the package 100 by using materials with similar CTE to the package 100. FIG. 2 also shows a plurality of fastener inserts 106 on a side 129 of the package 100, which allow for mounting of peripheral electronics and hardware, such as the circuit cards shown in FIG. 1, optical apertures and windows, temperature sensors, or cooling straps. The fastener inserts 106 provide threaded stress-free interfaces between the C—SiC or SiC package 100 and the fasteners 106 themselves.

FIG. 3 shows an embodiment of the package 100 of the present invention utilizing both active fluid flow and direct conduction. FIG. 3 is a transparent, side view of an embodiment of the package 100. FIG. 3 shows the coolant feedthrus 102 extending from one side 127 through the internal cavity 107 of the package 100 and the conductive material 108 to another side 128. FIG. 3 also shows the internal cavity 107 of the package 100 and the conductive material 108 used within the internal cavity 107. The use of conductive material 108, such as C—SiC foam, within the internal cavity 107 efficiently provides direct conduction and improves heat transfer from the high power integrated circuit 101 to the liquid coolant flowing through the feedthrus 102. When C—SiC foam is used as the conductive material 108 in the internal cavity 107, it is fabricated to fit precisely within the internal cavity 107. The C—SiC foam is bonded to the walls of the internal cavity 107 using a thermally compatible epoxy, a siliconization reflow process, or by reflowing a metal solder or braze material. The C—SiC foam is bonded to the walls of the internal cavity 107 so that the foam is in intimate thermal contact with the walls of the internal cavity 107 for improved direct heat conduction. The C—SiC foam also acts as a passive thermal conductor when no liquid coolant is flowing through the package 100 by effectively increasing the cross-sectional area of the package 100 through which heat is transferred. When there is active fluid flow, the C—SiC foam acts as a thermal transfer medium facilitating heat flow between the package 100 and liquid coolant.

In alternative embodiments, copper or other metal mesh are used as the conductive material 108 in the internal cavity 107. In some embodiments, metal mesh is preferable, such as in some embodiments when superior thermal conductivity (greater than 150 Watts $m^{-1} K^{-1}$) through the internal cavity 107 is desired or when the internal geometry of the package cavity makes using SiC or C—SiC foam difficult to machine to adequate tolerances. Metal mesh, when used as the conductive material 108 in the internal cavity 107, also is bonded to the walls of the internal cavity 107 using a thermally compatible bonding agent, such as solder or braze material.

FIG. 4 is a cross-sectional, bottom view of the package 100 of the present invention utilizing both active fluid flow and direct conduction. FIG. 4 shows the coolant feedthrus 102 passing through the internal cavity 107 of the package 100 and the conductive material 108 and extending from one side 127 to another side 128 of the package 100. The feedthrus 102 are connected using a nut-bolt interface 109. The feedthrus 102 are sealed against the sides of the body 110 of the package 100 using seals 112, such as rubber O-rings, or metal c-rings, c-seals, or other specialized seals to prevent cooling fluid from leaking out of the internal cavity 107. The connection of the feedthrus 102 using the nut-bolt interface 109 creates a compressive force on the sides 127, 128 of the package 100. The compressive force helps minimize tensile and shearing stress on the integrated circuit 101 and package 100, and helps avoid stress failures, caused by extreme temperature cycling. The compressive force on the seals 112 also creates a hermetic seal between the internal cavity 107 and the outside environment, preventing the coolant from contacting the integrated circuits, other peripheral electronics, or degrading a surrounding vacuum environment. The liquid coolant is provided from an outside source and enters the internal cavity 107 of the package 100 through one of the feedthrus 102 and exits the package 100 through the other feedthru 102. The flow of coolant through the internal cavity 107 provides heat transfer from the integrated circuit using active fluid flow.

Figure 6:
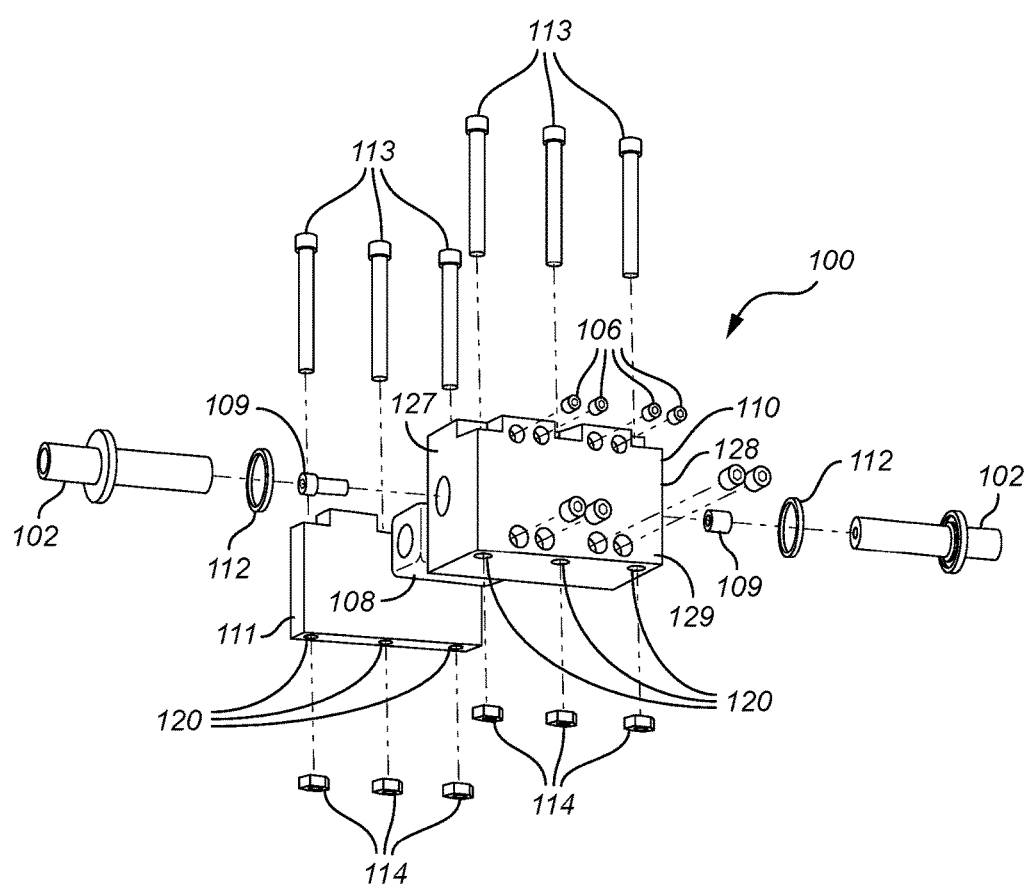
FIG. 6 is an exploded view of one embodiment of the thermally conductive, stress free package of the present invention for use in mounting high power emitter arrays or integrated circuits. The package of FIG. 6 utilizes both direct conduction and active fluid flow.

FIGS. 5 and 6 are exploded views of the package 100 of the present invention utilizing both active fluid flow and direct conduction. In these embodiments, the package 100 includes a body 110 and a side lid 111. The body 110 and lid 111 also are shown in FIG. 4. The body 110 is machined or otherwise fabricated to form the internal cavity 107 with a side opening. The lid 111 is machined or otherwise fabricated to cover the side opening of the body 110 to form the internal cavity 107. During the assembly process of this embodiment of the package 100, the lid 111 is bonded to the body 110 using epoxy, solder, braze or other bonding medium. FIGS. 5 and 6 also show the conductive material 108 used in the internal cavity 107, which is machined or otherwise fabricated to fit precisely within the internal cavity 107 to enhance heat transfer.

Both FIGS. 5 and 6 show the feedthrus 102, the nut-bolt interface 109, and the seals 112 for sealing the internal cavity 107 from the outside environment. The embodiment of FIGS. 5 and 6 includes two feedthrus 102. In some embodiments, additional coolant feedthrus 102 are used. In some embodiments, the number and positioning of one or more coolant feedthru depends, at least in part, on the shape or size of the package 100 or the heat transfer requirements. The feedthrus 102 in some embodiments are fabricated from a metal alloy with a low coefficient of thermal expansion, such as Invar, which has a compatible CTE to Silicon and C—SiC. The feedthrus 102 pass through the body 110 and into the internal cavity 107. In this embodiment, the feedthrus 102 are connected using the nut-bolt interface 109. When tightened, the nut-bolt interface 109 causes the feedthrus 102 to exert a compressive force on the sides 127, 128 of the package 100. The seals 112 also are compressed when the nut-bolt interface 109 is tightened. The seals 112 between the feedthrus 102 and package body 110 provide a hermetic interface at all temperatures from cryogenic to above room temperature.

FIGS. 5 and 6 also show a plurality of mounting bolts 113 and nuts 114 for use in mounting the package 100 and the integrated circuits onto thermal straps or rails, or other external surfaces. As shown in FIG. 4, the body 110 and lid 111 contain a plurality of thru-holes 120 for the mounting bolts 113. The thru-holes 120 and the mounting bolts 113 allow for mounting and tight bonding of the package 100 and integrated circuit 101 to a cooling strap or rail without creating any tensile or shearing stress on the package, which could cause failure of the package and integrated circuit at extreme temperatures.

The embodiment of FIGS. 5 and 6 also includes a plurality of fastener inserts 106 on a side 129 of the package 100 for use in mounting peripheral electronics and hardware. In some embodiments, the fastener inserts 106 vary in size, including 4/40, 6/32, 8/32, and 10/24. In some embodiments, the fastener inserts are included on more than one side of the package 100.

Figure 7:
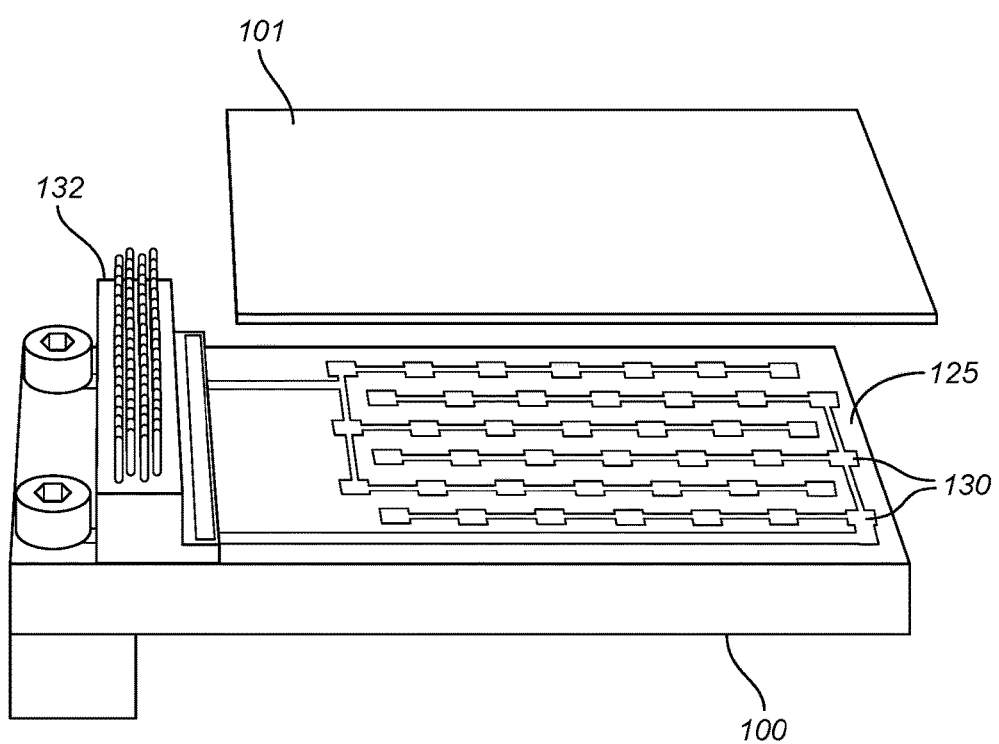
FIG. 7 is a perspective view of a high power emitter arrays or integrated circuit and one embodiment of the thermally conductive, stress free package of the present invention. The package of FIG. 7 utilizes direct conduction.
Figure 8:
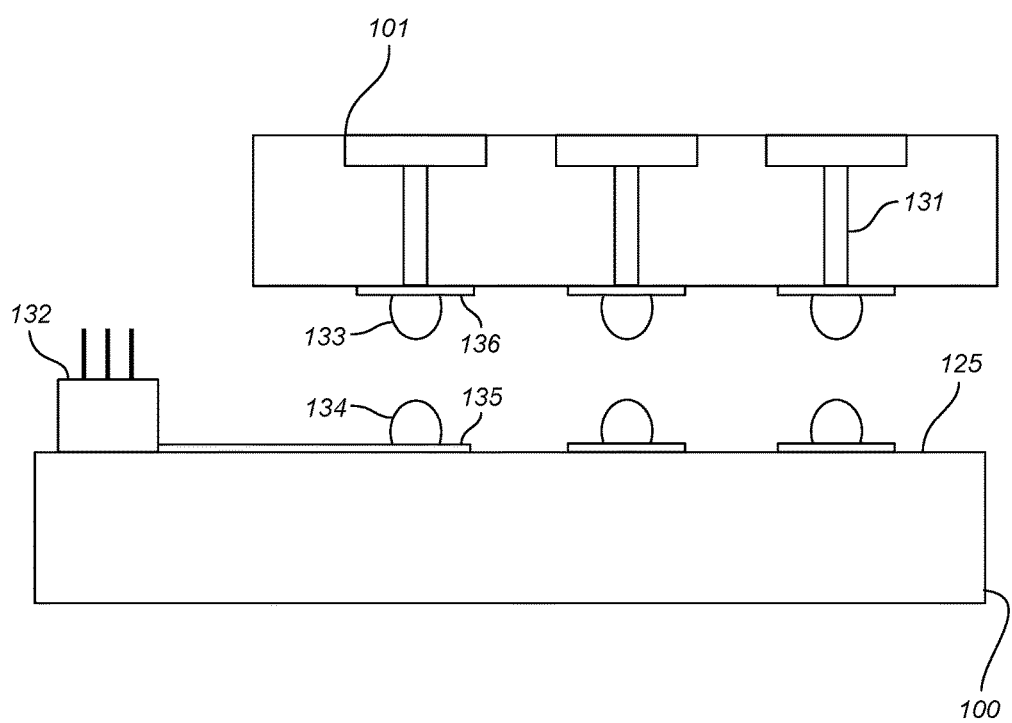
FIG. 8 is an enhanced side view of a high power emitter array or integrated circuit and one embodiment of the thermally conductive, stress free package of the present invention. The package of FIG. 8 utilizes direct conduction.

A further embodiment of the present invention is shown in FIGS. 7 and 8, which is a package 100 that provides heat transfer through direct conduction without active fluid flow. In this embodiment, the package 100 is made from SiC or C—SiC material that is thermally matched to the integrated circuits or emitter arrays. The top surface 125 of the package 100 contains patterns of electrical traces 130 with contact pads 135 and metal bumps 134. The electrical traces 130 are used for Thru Silicon Via 131 interconnection to the high power integrated circuit or emitter array 101. The electrical traces 130 provide electrical routing to the integrated circuit 101 from an attached interconnect board 132. In this embodiment, the package 100 provides direct conduction from the integrated circuit 101 into the package through the interconnections of the electrical traces 130. Further, because the electrical traces 130 are distributed across the interface between the integrated circuit 101 and package 100, thermally induced stress between the integrated circuit 101 and the package 100 is reduced or eliminated.

The package 100 of the present invention allows precision alignment of infrared emitter arrays to be maintained in temperature ranges between cryogenic to above room temperature. Precision alignment is achieved through one of several methods. One method is use of precisely placed reference pins in the wall of the package 100. The pins provide mechanical surfaces against which the integrated circuit 101 or emitter array rests. A second method is to machine precisely toleranced grooves into the package 100 to provide mechanical stops for placing the integrated circuit or emitter array. SiC and C—SiC can be machined to extremely fine tolerances, making such material ideal when accurately placed mechanical features are needed. A further method is to bond the emitter array or integrated circuit onto the package 100, using precision alignment tooling that uses reference datums on the array and package. In this third method the emitter array or integrated circuit is aligned over the package 100, brought into contact with the flat top surface 125 of the package 100, and then bonded to the package 100 using a solder or epoxy or other means.

The package 100 of the present invention eliminates physical stresses that may arise as the silicon integrated circuit and package 100 change temperature. The package 100 of the present invention can vary in shape, can be scaled up or down in size, can be fabricated to accommodate a plurality of integrated circuits or emitter arrays, and can be used for the assembly of large area infrared emitter arrays and other high power integrated circuits, which operate at a wide range of temperatures, including cryogenic temperatures.

Figure 9:
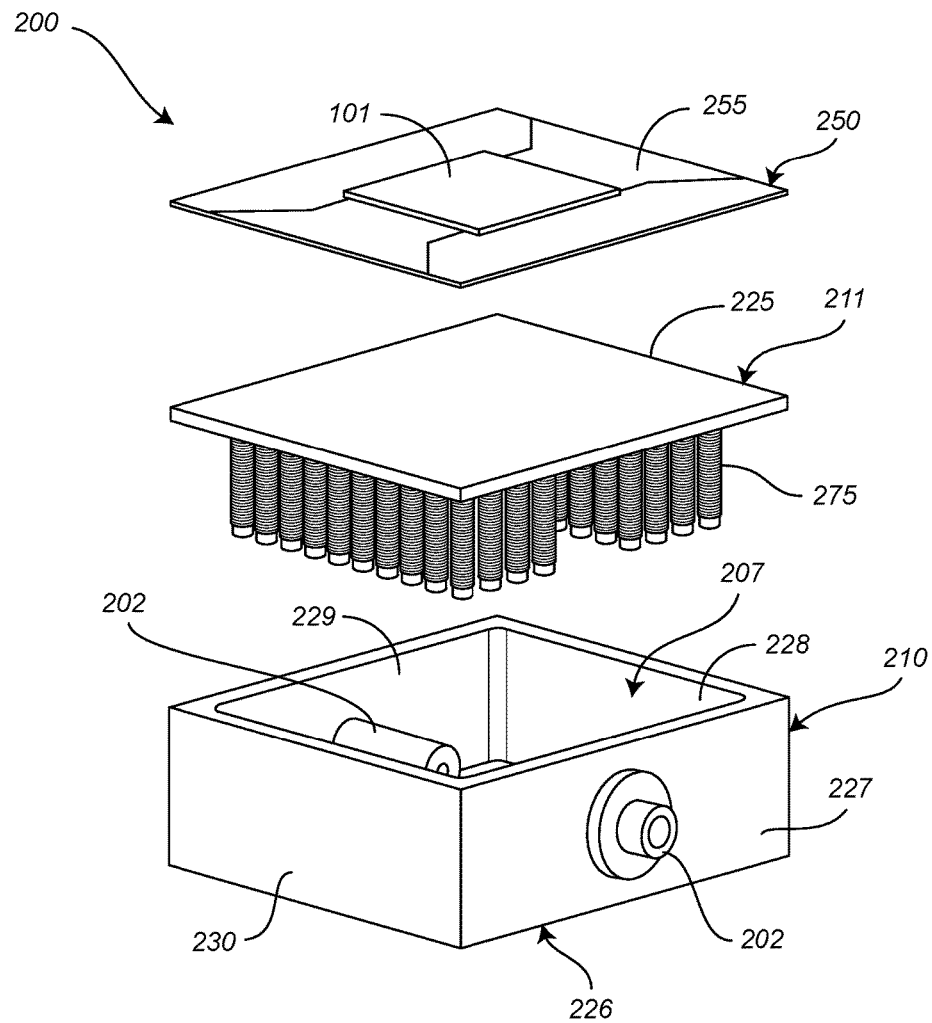
FIG. 9 is an exploded view of one embodiment of the thermally conductive, stress free package of the present invention for use in mounting high power emitter arrays or integrated circuits. The package of FIG. 9 includes a plurality of coils and utilizes both direct conduction and active fluid flow.
Figure 10A:
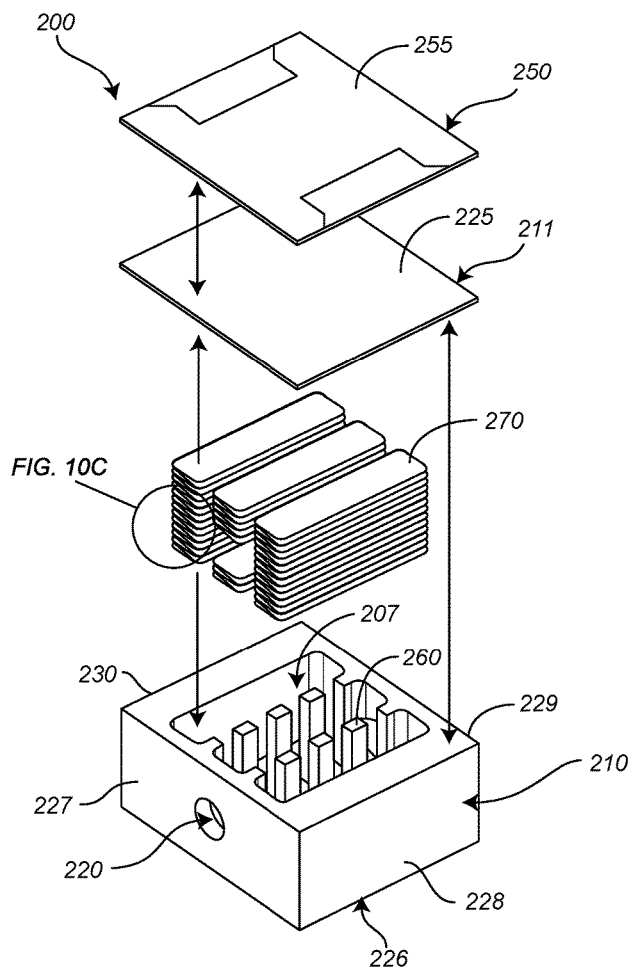
FIG. 10A is an exploded view of one embodiment of the thermally conductive, stress free package of the present invention for use in mounting high power emitter arrays or integrated circuits. The package of FIG. 10A includes a plurality of membranes and utilizes both direct conduction and active fluid flow.
Figure 10B:
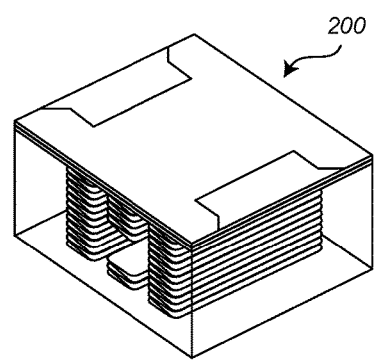
FIG. 10B is a transparent, perspective view of the thermally conductive, stress free package of FIG. 10A.
Figure 10C:
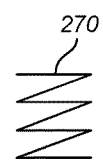
FIG. 10C is a graphic representation of an end view of an embodiment of a membrane of the present invention.
Figure 10D:
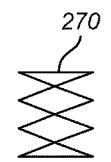
FIG. 10D is a graphic representation of an end view of an embodiment of the membrane of the present invention.
Figure 11:
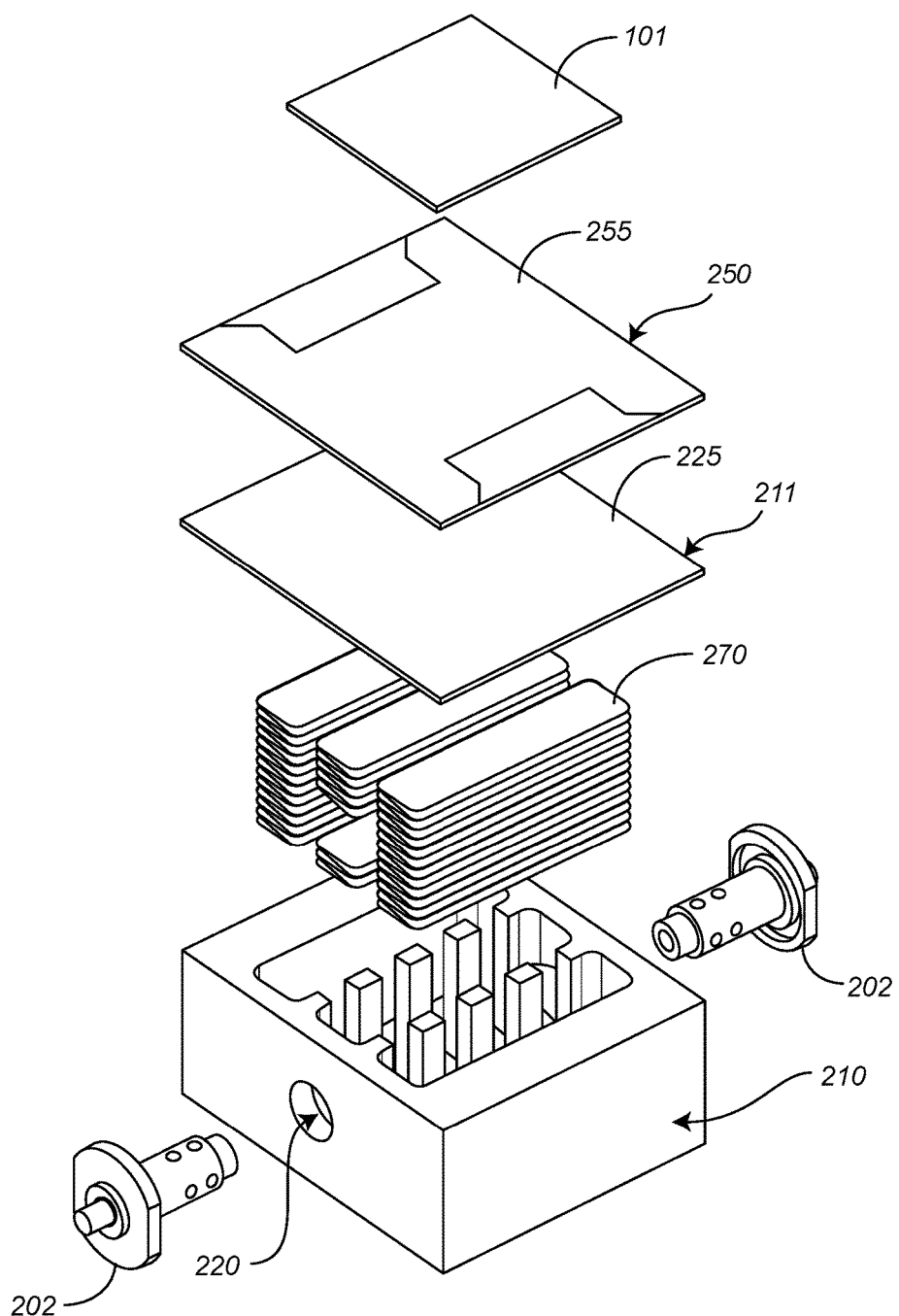
FIG. 11 is an exploded view of one embodiment of the thermally conductive, stress free package of the present invention for use in mounting high power emitter arrays or integrated circuits. The package of FIG. 11 utilizes both direct conduction and active fluid flow.

Referring to FIGS. 9 and 11, some packages 200 of the present invention comprise a body 210 forming an internal cavity 207. In some embodiments, the body comprises opposed first 227 and third 229 side walls extending between opposed second 228 and fourth 230 side walls. In some such embodiments, a bottom panel 226 extends between bottom edges of each side wall, thereby defining an internal cavity 207 having an open top. In some embodiments, the package 200 includes a lid 211 that is configured to selectively engage with top edges of each side wall, thereby enclosing the internal cavity 207. In some such embodiments, the lid is formed from the same material as the body 210 or from a material having similar CTE values as the body 210. In some embodiments, the lid 211 defines an outer surface 225 opposed to the internal cavity 207 of the body 210.

In some embodiments, the package 200 includes one or more heat spreader 250 coupled to one or more interface surface. In some embodiments, the outer surface 225 of the lid 211 forms at least part of the interface surface. In other embodiments, one or more interface surface is formed at least in part from an outer surface of the bottom panel 226 and/or to one or more outer surface of one or more side wall. In some embodiments, the heat spreader 250 defines an inner surface (not shown) and an opposed outer surface 255. In some embodiments, the inner surface of the heat spreader 250 is configured to engage with the outer surface 225 of the lid and/or another outer surface of the body, such as with a respective outer surface of the bottom panel 226 and/or a side wall, as applicable.

In some embodiments, the inner surface of the heat spreader defines a first area and the corresponding outer surface of the lid 211 and/or the body 210 defines a second area. In some embodiments, the first area is significantly smaller than the second area. In some such embodiments, the first area is approximately 50% the size of the second area. In some embodiments, the first area is substantially the same size as the second area. In some such embodiments, the first area is at least 90% the size of the second area. In some embodiments, the first area is at least 95% or 98% of the second area. In some embodiments, the first area is the same size as the second area. In some embodiments, a material, such as a brazing material and/or a bonding agent, bonds substantially the entire first area to the second area.

In some embodiments, the outer surface 255 of the heat spreader 250 is configured to selectively engage with one or more component 101, such as one or more high power integrated circuit and/or one or more high power emitter array. In some embodiments, the component 101 is a single monolithic chip, such as a single monolithic chip associated with a cryogenically operated Infrared Light Emitting Diode array, a cryogenically operated resistive, carbon nanotube, or other emitter array, or any other array now known or later developed. In some embodiments, the heat spreader is formed, at least in part, from a chemical vapor deposited ("CVD") grown diamond.

In some embodiments, the package 200 includes a first coolant feedthru 202 extending into the internal cavity 207 through a first thru hole 220 defined by the first side wall 227, thereby defining a coolant inlet and/or outlet. In some embodiments, a second coolant feedthru 202 extends into the internal cavity 207 through a second thru hole 220, thereby defining a coolant inlet and/or outlet. In some embodiments, the second thru hole 220 is defined by the third side wall 229 such that the first and second feedthrus are opposed to each other.

In some embodiments, coolant flowing into the internal cavity 207 is in a liquid state and coolant flowing out of the internal cavity 207 is in a liquid and/or gaseous state. In some embodiments, the package 200 is designed to direct liquid and/or gas out of the internal cavity 207, such as through the first and/or second coolant feedthrus, when pressure increases within the internal cavity 207, such as when the coolant expands due to a change from a liquid state to a gas state.

Coolant within the internal cavity 207 is in thermal communication with the package 200, which is in thermal communication with the component 101. In this way, the coolant is in fluid communication with the component 101. As heat is generated by the component, heat energy transfers through the package 200 into the coolant, thereby increasing the temperature of the coolant. In some embodiments, one or more items is positioned within the internal cavity 207, thereby increasing heat transfer to the coolant while reducing overall volume of the coolant within the internal cavity 207. One or more such items is positioned and oriented within the internal cavity 207 so as to allow coolant within the internal cavity 207 to flow out of the internal cavity 207, thereby causing heat energy from the component 101 to be removed from the package 200, while allowing additional coolant to flow into the internal cavity 207, thereby enabling additional heat energy from the component 101 to flow into the new coolant. In this way, a constant flow of coolant facilitates a constant flow of heat energy away from component 101.

In some embodiments, the package 200 is configured to operate in a vacuum or other low pressure environment and/or otherwise where an internal pressure within the internal cavity 207 is higher than an external pressure within which the package 200 is located (the "differential operational pressure"). In some such embodiments, the lid 211 is configured to provide enough rigidity to prevent cracking or other damage to the heat spreader 250 and/or the component 101 for standard differential operational pressures and/or for elevated differential operational pressure.

In some embodiments, the package 200 includes one or more feature for eliminating or otherwise reducing risks of elevated differential operational pressure. In some embodiments, elevated differential operational pressure is caused when waste gas is produced in the internal cavity 207 and/or when waste gas is unable to easily escape the internal cavity 207. In some embodiments, waste gas is produced when liquid coolant is heated to its vaporization point, thereby causing the coolant to expand from a liquid state to a gas state. In some embodiments depending on coolant type, coolant does not reach its vaporization temperature. In other embodiments, the internal cavity 207 includes one or more feature that is configured to facilitate flow of gas through the internal cavity 207 and out one or more coolant feedthru 202 such that internal pressure buildup within the internal cavity 207 is sufficiently minimized.

In some embodiments, a pillar or 'strut' 260 is positioned within the internal cavity 207. In some embodiments, the pillar 260 is configured to reduce the volume of coolant allowed within the internal cavity 207 while allowing fluid to flow to one or more coolant feedthru 202. In some embodiments, the pillar 260 is in thermal communication with the lid 211 and the coolant, thereby increasing the rate of heat transfer between the component 101 and the coolant. In some embodiments, a plurality of pillars 260 are positioned within the internal cavity 207.

In some embodiments, the pillar 260 extends from an inner surface of the bottom panel 226 and/or from an inner surface of the lid 211. In some such embodiments, the pillar 260 is formed from the same piece of material as the bottom panel 226 or the lid 211. In other such embodiments, the pillar 260 is otherwise secured to the inner surface of the bottom panel 226 and/or the inner surface of the lid 211, such as by brazing or the like. In some embodiments, the pillar 260 extends between opposed inner surfaces of the bottom panel 226 and the lid 211. In some such embodiments, the pillar 260 is secured to opposed inner surfaces of the bottom panel 226 and the lid 211, thereby increasing the structural rigidity of the lid 211.

Referencing FIG. 9, some embodiments include a coil 275 positioned within the internal cavity 207. In some embodiments, the coil 275 is configured to reduce the volume of coolant allowed within the interior cavity while allowing fluid to flow to one or more coolant feedthru 202. In some embodiments, the coil 275 is in thermal communication with the lid 211 and the coolant, thereby increasing the rate of heat transfer between the component 101 and the coolant. In some embodiments, a plurality of coils 275 are positioned within the internal cavity 207.

In some embodiments, the coil 275 extends from an inner surface of the bottom panel 226 and/or from an inner surface of the lid 211. In some embodiments, the coil 275 is secured to the inner surface of the bottom panel 226 and/or the inner surface of the lid 211, such as by brazing or the like. In some embodiments, the coil 275 is formed from a material having good thermal conductivity and/or ductile properties, such as copper or copper tungsten.

In some embodiments, the coil 275 is a low-density coil. In some embodiments, the coil 275 is configured to bend with thermal transitions, thereby eliminating or otherwise reducing associated stress concentrations. In some embodiments, a pillar 260 extends through an internal area of the coil 275. In some such embodiments, a pillar 260 limits movement of the coil 275, such as movement associated with fluid flowing through the coil 275

Referencing FIGS. 10A, 10B, 10C, 10D, and 11, some embodiments include a membrane 270 positioned within the internal cavity 207. In some embodiments, the membrane 270 is configured to reduce the volume of coolant allowed within the interior cavity 207 while maintaining a path for fluid to flow to one or more coolant feedthru 202. In some embodiments, the membrane 270 is in thermal communication with the lid 211 and the coolant, thereby increasing the rate of heat transfer between the component 101 and the coolant. In some embodiments, a plurality of membranes 270 are positioned within the internal cavity 207.

In some embodiments, the membrane 270 extends from an inner surface of the bottom panel 226 and/or from an inner surface of the lid 211. In some embodiments, the membrane 270 is secured to the inner surface of the bottom panel 226 and/or the inner surface of the lid 211, such as by brazing or the like. In some embodiments, the membrane 270 is formed from a material having good thermal conductivity and/or ductile properties, such as copper or copper tungsten.

In some embodiments, the membrane 270 is configured to bend with thermal transitions, thereby eliminating or otherwise reducing associated stress concentrations. In some embodiments, the membrane 270 is formed from a plurality of segments separated by fold lines. In some such embodiments, the membrane 270 is configured to bend at or near each fold line. In some embodiments, the membrane 270 is positioned adjacent to one or more pillar 260. In some such embodiments, the one or more pillar 260 limits movement of the membrane 270, such as movement associated with fluid flowing through the membrane 270.

In some embodiments, the membrane 270 is formed at least in part from a mesh and/or a perforated sheet. In some embodiments, the membrane 270 is configured so as to facilitate fluid flow through the membrane 270. In some embodiments, each segment is substantially parallel with, but slightly angled away from, an adjacent segment so as to define a fin having a distal end defined by a fold line separating the adjacent segments. In some embodiments, the membrane 270 comprises a plurality of fins.

In some embodiments, one or more component is soldered to, brazed to or otherwise secured to one or more other component. In some embodiments, material used to solder, braze, or otherwise secure components together are selected from indium metal, indium/tin, copper/silver, Titanium-Platinum-Gold, Copper-Silver-Titanium, and related alloys.

What is claimed is:

1. A package for controlling temperature and avoiding thermally induced stress in a component, the package comprising:
   a body defining an internal cavity;
   a lid secured to said body, thereby enclosing said internal cavity;
   a heat spreader secured to an interface surface, said interface surface being formed at least in part from one of an outer surface of said lid or an outer surface of said body;
   a first feedthru extending through said body into said internal cavity, said first feedthru defining a passageway for coolant to travel into said internal cavity; and
   a second feedthru extending through said body into said internal cavity, said second feedthru defining a passageway for coolant to travel out of said internal cavity,
   wherein the package is configured to dissipate heat energy generated by the component at least in part by transferring the heat energy to the coolant, and
   wherein the package is configured to facilitate rigidly affixing the component to the heat spreader of the package.

2. The package of claim 1, wherein said heat spreader is formed at least in part from a chemical vapor deposited grown diamond.

3. The package of claim 2, wherein an inner surface of said heat spreader is bonded to said interface surface, said inner surface of said heat spreader defining a first area and said interface surface defining a second area substantially similar in size to the first area.

4. The package of claim 2, further comprising a pillar positioned within said internal cavity of said body, said pillar extending between an inner surface of said lid and an opposed inner surface of said body, said pillar being in thermal communication with the component and the coolant.

5. The package of claim 2, further comprising a coil extending from an inner surface of said lid, said coil being in thermal communication with the component and the coolant.

6. The package of claim 5, further comprising a pillar extending through a center portion of said coil, said pillar extending between an inner surface of said lid and an opposed inner surface of said body, said pillar being in thermal communication with the component and the coolant.

7. The package of claim 2, further comprising a membrane extending from an inner surface of said lid, said membrane being in thermal communication with the component and the coolant.

8. The package of claim 7, further comprising a pillar positioned adjacent to said membrane, said pillar extending between an inner surface of said lid and an opposed inner surface of said body, said pillar being in thermal communication with the component and the coolant.

9. The package of claim 7, wherein said membrane comprises a plurality of segments separated by fold lines.

10. The package of claim 9, wherein each segment of said membrane is substantially parallel with but slightly angled away from, an adjacent segment so as to define a fin having a distal end defined by a fold line separating the adjacent segments.

11. The package of claim 1, further comprising a pillar positioned within said internal cavity of said body, said pillar extending between an inner surface of said lid and an opposed inner surface of said body, said pillar being in thermal communication with the component and the coolant.

12. The package of claim 1, further comprising a coil extending from an inner surface of said lid, said coil being in thermal communication with the component and the coolant.

13. The package of claim 12, further comprising a pillar extending through a center portion of said coil, said pillar extending between an inner surface of said lid and an opposed inner surface of said body, said pillar being in thermal communication with the component and the coolant.

14. The package of claim 1, further comprising a membrane extending from an inner surface of said lid, said membrane being in thermal communication with the component and the coolant.

15. The package of claim 14, further comprising a pillar positioned adjacent to said membrane, said pillar extending between an inner surface of said lid and an opposed inner surface of said body, said pillar being in thermal communication with the component and the coolant.

16. The package of claim 14, wherein said membrane comprises a plurality of segments separated by fold lines.

17. The package of claim 16, wherein each segment of said membrane is substantially parallel with but slightly angled away from, an adjacent segment so as to define a fin having a distal end defined by a fold line separating the adjacent segments.

18. A method of fabricating a package for controlling temperature and avoiding thermally induced stress in a component, the method comprising:
    fabricating a body of the package from a material having a Coefficient of Thermal Expansion (CTE) compatible with the CTE of the component, the body having a plurality of sides and defining an internal cavity;
    installing first and second feedthrus to the body of the package, the first feedthru extending from one of the plurality of sides and a second feedthru extending from another of the plurality of sides, each feedthru defining a passageway into the internal cavity, thereby allowing coolant to flow into the internal cavity through the first feedthru and out of the internal cavity through the second feedthru;
    securing a lid of the package to the body of the package, thereby enclosing the internal cavity; and
    securing a heat spreader to an interface surface, said interface surface being formed at least in part from one of an outer surface of the lid or an outer surface of the body,
    wherein the component is taken from a list comprising high power integrated circuits and high power emitter arrays,
    wherein the package is configured to facilitate rigidly affixing the component to the heat spreader of the package.

19. The method of claim 18, wherein the heat spreader is formed at least in part from a chemical vapor deposited grown diamond.

20. The method of claim 18, further comprising securing an object to an inner surface of the lid such that the object is in thermal communication with the lid, the object being positioned within the internal cavity of the body when the lid is secured to the body.

21. The method of claim 20, wherein the object is one of:
    a pillar extending between the inner surface of the lid and an opposed inner surface of the body;
    a coil; and
    a membrane extending between the inner surface of the lid and an opposed inner surface of the body, the membrane comprising a plurality of segments separated by fold lines.

22. A method of controlling temperature and avoiding thermally induced stress in a component, the method comprising flowing a volume of coolant through an internal cavity of a package, wherein the package comprises:
    a body defining an internal cavity;
    a lid secured to the body, thereby enclosing said internal cavity;
    a heat spreader secured to an interface surface, the interface surface being formed at least in part from one of an outer surface of the lid or an outer surface of the body;
    a first feedthru extending through the body into the internal cavity, the first feedthru defining a passageway for coolant to travel into the internal cavity; and
    a second feedthru extending through the body into the internal cavity, the second feedthru defining a passageway for coolant to travel out of the internal cavity,
    wherein the package is configured to dissipate heat energy generated by the component at least in part by transferring the heat energy to the coolant, and
    wherein the package is configured to facilitate rigidly affixing the component to the heat spreader of the package.

23. The method of claim 22, wherein the heat spreader is formed at least in part from a chemical vapor deposited grown diamond.

24. The method of claim 22, further comprising securing an object to an inner surface of the lid such that the object is in thermal communication with the lid, the object being positioned within the internal cavity of the body when the lid is secured to the body.

25. The method of claim 24, wherein the object is one of:
    a pillar extending between the inner surface of the lid and an opposed inner surface of the body;
    a coil; and
    a membrane extending between the inner surface of the lid and an opposed inner surface of the body, the membrane comprising a plurality of segments separated by fold lines.

* * * * *